(12) United States Patent
Turvey (10) Patent No.: US 7,174,143 B1
(45) Date of Patent: Feb. 6, 2007

(54) RECEIVER CIRCUIT WITH TRANSMISSION LOSS COMPENSATION

(75) Inventor: Anthony E. Turvey, Reading, MA (US)

(73) Assignee: Analog Devices, Inc., Norwood, MA (US)

( * ) Notice: Subject to any disclaimer, the term of this patent is extended or adjusted under 35 U.S.C. 154(b) by 481 days.

(21) Appl. No.: 10/752,881

(22) Filed: Jan. 6, 2004

Related U.S. Application Data (60) Provisional application No. 60/441,821, filed on Jan. 21, 2003.

(51) Int. Cl.
*H04B 17/00* (2006.01)
*H04B 1/04* (2006.01)

(52) U.S. Cl. .................. 455/226.1; 455/130; 455/114.2

(58) Field of Classification Search ............. 455/226.1, 455/130, 114.2, 114.3, 226.2, 226.3, 423, 455/67.11; 330/252, 292, 256
See application file for complete search history.

(56) References Cited

U.S. PATENT DOCUMENTS

| | | | | |
|---|---|---|---|---|
| 4,197,500 A | * | 4/1980 | Klein et al. .................. 455/62 |
| 4,855,687 A | * | 8/1989 | Hebert .................. 330/304 |
| 4,882,482 A | * | 11/1989 | Smith et al. ............. 250/214 A |
| 5,051,687 A | * | 9/1991 | So .............. 323/357 |
| 5,392,000 A | * | 2/1995 | Gillig .......... 330/107 |
| 5,471,665 A | * | 11/1995 | Pace et al. .............. 455/343.2 |
| 5,874,861 A | * | 2/1999 | Nagase et al. ............. 330/308 |
| 6,169,457 B1 | * | 1/2001 | Ichimaru ................ 331/17 |
| 6,313,682 B1 | | 11/2001 | Muller, Jr. et al. ......... 327/291 |
| 6,360,180 B1 | | 3/2002 | Breger ........ 702/108 |
| 6,498,473 B1 | | 12/2002 | Yamabe .......... 324/158.1 |
| 6,784,750 B2 | * | 8/2004 | Chiou et al. ............... 330/308 |

* cited by examiner

*Primary Examiner*—Sonny Trinh
(74) *Attorney, Agent, or Firm*—Koppel, Patrick & Heybl (57) ABSTRACT

Transmission loss compensation is provided for receiver circuits in general, including an ATE receiver circuit having a voltage-to-current converter, such as a transconductance amplifier, that receives a distorted DUT signal and provides an output to a current-to-voltage converter, such as a transimpedance amplifier. The compensation circuit injects a compensation current into the current-to-voltage converter to compensate for transmission losses. The compensation circuit can be configured to inject a plurality of transient compensation currents with different respective time constants and peak values.

29 Claims, 4 Drawing Sheets

RECEIVER CIRCUIT WITH TRANSMISSION LOSS COMPENSATION

RELATED APPLICATION

This application claims the benefit of provisional patent application Ser. No. 60/441,821, filed Jan. 21, 2003.

BACKGROUND OF THE INVENTION

1. Field of the Invention

This invention relates to the compensation of transmission losses in signals received by a receiver circuit.

2. Description of the Related Art

High speed automatic test equipment (ATE) systems have sufficiently high receive bandwidth that nonidealities in the transmission medium between the device under test (DUT) and the ATE pin electronics often contribute a significant limitation to overall system performance. This transmission medium, or path, generally comprises several cables, connectors, printed circuit board traces and "pogo pins" that ultimately make contact with the DUT. The losses associated with such components primarily manifest as the "skin effect", in which the resistance seen by the propagating signal becomes an increasing function of frequency. Because every signal can be represented by a superposition of many frequency components, certain components of the signal suffer greater loss than others, thus producing a dispersive effect that degrades the received signal. If the original signal is to be presented to the pin electronics with minimal distortion, great care must be taken in the design of the transmission path. In many cases, however, the frequency components present in very high speed signals are so high that even the best quality transmission path can cause significant degradation in the signal integrity. In such cases the pin electronics receiver, typically a comparator, can provide special circuitry to compensate for the expected transmission losses. Such circuitry is often included as a part of the pin electronics comparator, and is generally referred to as cable loss compensation.

Figure 1:
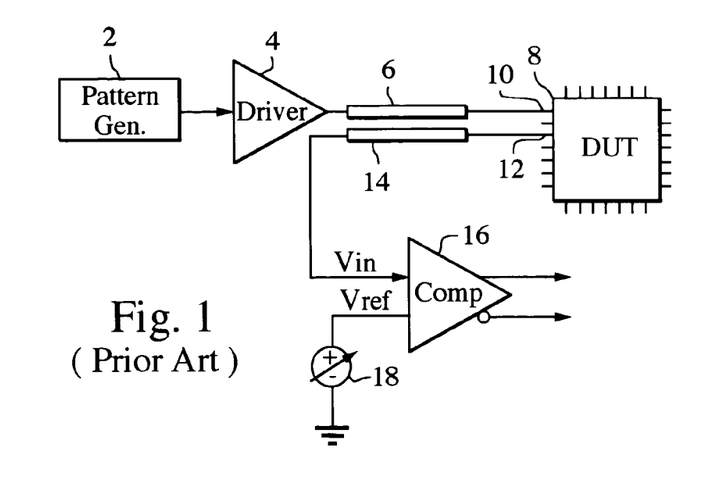
FIG. 1 is a simplified block diagram of a conventional ATE drive and receiver channel.

A typical ATE setup is illustrated in simplified form in FIG. 1. A pattern generator 2 controls the operation of a driver 4, which transmits test signal pulses through a transmission medium 6 to a DUT 8.

As illustrated, the test signal is applied to a DUT input pin 10, with the DUT response taken from an output pin 12 and transmitted via another transmission medium 14 to a comparator 16, where it is compared with a threshold reference voltage supplied by a reference voltage generator 18 that is typically programmable. Instead of applying the test signal to a DUT input pin and taking the DUT response from a separate pin, both transmission media could be connected to a single DUT input/output pin. The DUT will typically include hundreds of pins, some of which can be input, others output, and the remainder input/output. The comparator 16 produces a differential output that indicates whether the input voltage Vin from the DUT exceeds or is less than the threshold reference voltage Vref.

Figure 2:
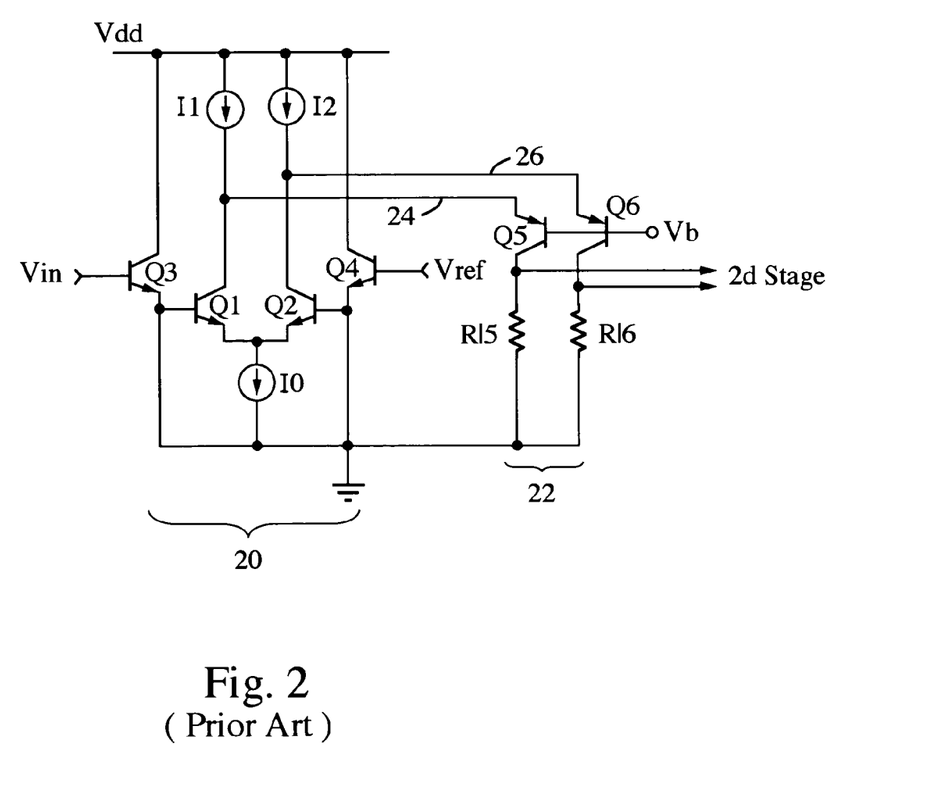
FIG. 2 is a simplified schematic diagram of a first stage for a conventional comparator in the ATE receiver.

FIG. 2 illustrates in simplified form a commonly implemented comparator input stage using bipolar process technology. Vin is the dynamic signal received from the DUT, while Vref is the static reference against which it is compared. The input stage includes a voltage-to-current converter (VTC), implemented as a transconductance amplifier 20, which provides an output to a current-to-voltage converter (CTV), implemented as a transimpedance amplifier 22. The transimpedance amplifier in turn produces an output to drive the comparator's second stage, which may be similar in design to the first stage.

In this illustration, the transconductance amplifier 20 includes a pair of npn transistors. Q1 and Q2 connected respectively in input and reference branches, with a current source I0 connected to the emitters of both transistors to draw current through them, and current sources I1 and I2 supplying currents to the collectors of Q1 and Q2, respectively. I1 and I2 are both nominally equal to a value greater than I0/2. The input voltage Vin is applied to the base of a buffer npn transistor Q3, the emitter of which is connected to the base of Q1, while the reference voltage Vref is connected to the base of an npn buffer transistor Q4, the emitter of which is connected to the base of Q2. Differential amplifier outputs are taken along lines 24 and 26 from the collectors of Q1 and Q2, respectively.

When Vin is less than Vref, a greater current will flow through Q2 than through Q1. The current on transconductance output line 24, which is equal to (I1–IQ1), will accordingly be greater than the current on output line 26, which is equal to (I2–IQ2). Conversely, when Vin exceeds Vref the portion of I1 diverted to output line 24 will be less than the portion of I2 diverted to output line 26. The voltage differential between Vin and Vref is thus converted to a current differential between lines 24 and 26.

Transimpedance amplifier 22 is implemented with a pair of pnp transistors Q5 and Q6 which have their bases connected in common to a bias level Vb, their emitters connected respectively to lines 24 and 26, and their collectors connected respectively to load resistors Rl5 and Rl6. The transimpedance amplifier's differential output is taken from the collectors of Q5 and Q6 and supplied to the comparator's second stage.

In available pin electronics circuitry, cable loss compensation has been implemented by adding a first order peaking response to the comparator input stage. The common method is to differentiate the input signal, and superimpose the result onto the threshold (reference) input. In the circuit of FIG. 2, this is accomplished by modulating the ordinarily static Vref input so as to pre-distort the apparent threshold in such a way as to compensate for degradations in the dynamic Vin signal.

Figure 3:
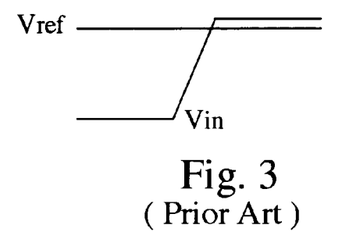
FIG. 3 is a diagram illustrating ideal input and reference signals to an ATE receiver circuit.
Figure 4:
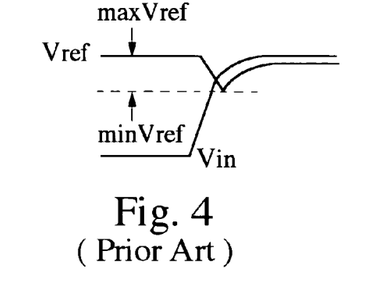
FIG. 4 is a graph illustrating an actual input signal which shows the effects of cable loss, and a reference signal that has been adjusted in a known manner to compensate for the cable loss.

This concept is illustrated in FIGS. 3 and 4. FIG. 3 illustrates the ideal case, in which Vin rises rapidly and linearly from a low state well below Vref to a high state above Vref, and maintains this level for the duration of the pulse. Recognition of the leading edge is triggered by Vin exceeding Vref.

FIG. 4 illustrates a more practical case when unavoidable cable losses are considered. The rising edge slope of Vin gradually tapers towards its upper end, rather than continuing linearly to a maximum value as in FIG. 3. This can be approximately compensated by reducing Vref by an amount proportional to the slope of Vin. Thus, when Vin begins to rise linearly, Vref decreases linearly from its maximum value maxVref. This continues until the slope of Vin begins to taper, at which point Vref reaches its minimum value minVref and then gradually rises back to maxVref as the slope of Vin approaches zero. Due to the dip in Vref, the effect of the nonlinear Vin slope is approximately compensated. Because the input differential (Vin–Vref) in FIGS. 3 and 4 is identical, the comparator output response would be the same in both cases, thus compensating for the distortion imposed upon the signal by the nonideal transmission path.

Figure 5:
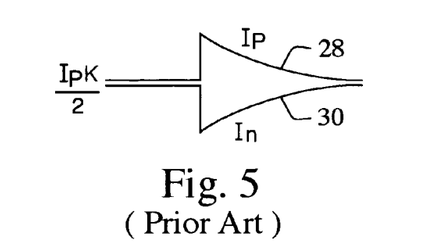
FIG. 5 is a graph illustrating compensation currents that are injected into the reference input to the comparator in a known cable loss compensation scheme.

FIG. 5 illustrates a pair of complementary currents Ip and In that are generated to implement the compensation. Ip abruptly increases from Ipk/2 and then gradually tapers back to Ipk/2 along an exponential path 28, while In abruptly decreases from Ipk/2 and then gradually increases along exponential path 30 back up to Ipk/2. To the extent that the cable loss characteristics can be represented by a single pole time constant response such as in FIG. 5, these currents can be applied to the reference input of a comparator to produce the desired compensation response. In general, cable loss effects are multi-order, and a single-order scheme can provide only an approximate compensation.

Figure 6:
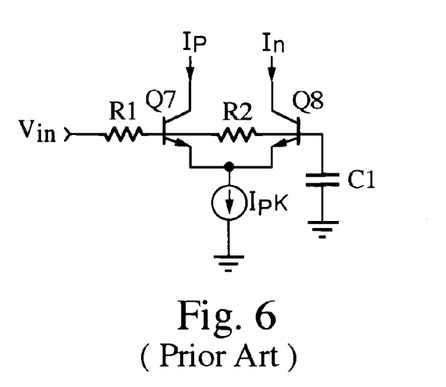
FIG. 6 is a simplified schematic diagram illustrating a circuit that has been used to generate the compensation currents of FIG. 5.

FIG. 6 illustrates a circuit that has been used to differentiate the input signal to provide the complementary currents Ip and In. This is only one of several designs that could be used. A pair of npn bipolar transistors Q7 and Q8 are differentially connected, with the base of Q7 connected through a resistor R1 to Vin, the bases of Q7 and Q8 connected to each other through a resistor R2, and the base of Q8 connected to a fixed voltage level (such as ground) through a capacitor C1. A current source Ipk is connected to the emitters of Q7 and Q8 to draw current through the transistors, with the collector currents of Q7 and Q8 establishing Ip and In, respectively.

Before the arrival of a Vin pulse, Q7 and Q8 are equally biased, causing Ip and In to share the current Ipk equally, with respective values of Ipk/2. When a Vin pulse first arrives, C1 appears as a short circuit or very low impedance, allowing a current to flow through the RC circuit to increase the base bias of Q7, but not Q8. This diverts a portion of the Ipk current from Q8 to Q7, causing Ip to abruptly rise and In to abruptly fall. As C1 charges up with an exponential characteristic, it takes more and more of the Vin voltage, gradually raising the base bias on Q8 until it equalizes with the base bias of Q7. This restores Ip and In to equality with Ipk/2 along the paths 28 and 30 of FIG. 5.

Figure 7:
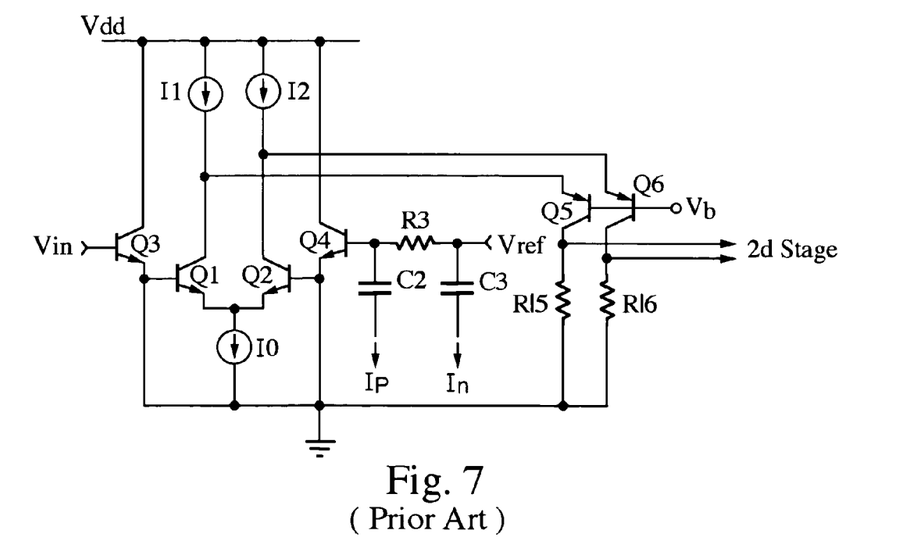
FIG. 7 is a simplified schematic diagram illustrating how the compensation currents can be applied to the comparator's reference input.

The correction currents Ip and In are generally applied to the comparator reference input using a technique such as that illustrated in FIG. 7. A resistor R3 is connected to the base of Q4 at the input side of the comparator. Ip and In are then imposed across R3 to produce the voltage compensation. A disadvantage of this method is that a resistor inserted at this point in the circuit causes a destabilizing effect, and its resistance must therefore be kept relatively small. This implies that the Ip and In currents must be made correspondingly large to generate a corrective signal of sufficient amplitude.

To overcome this limitation, the Ip and In currents are AC coupled to opposite ends of R3 through respective capacitors C2 and C3. If the capacitor on the input side of the emitter follower Q4 is sufficiently large, it can re-stabilize the follower despite the presence of the resistor. However, it is still necessary to provide a relatively large resistor to prevent Ip and In from becoming excessive. As an example, assume that a 4V signal is to be applied at the comparator input, and a requirement exists for a 20% peaking amplitude. It is therefore necessary to impose a compensating signal of 0.8V (20% of 4V) on the reference input. If resistor R3 is made to be 200 Ohm, then Ip and In must have magnitudes of approximately +/−4 mA. This requires substantial power dissipation. Furthermore, the RC time constant formed by the resistor and the coupling capacitors can interfere with the desired time constant of Ip and In. For these reasons, it is very difficult to use this method for anything other than a simple first order cable loss compensation scheme.

While the above description is for ATE circuits, similar problems exist with other receiver circuits for differential signals, such as differential line receivers for clock or data recovery circuits, and telecommunication input circuits.

SUMMARY OF THE INVENTION

In accordance with one embodiment of the invention, a compensation signal is applied to the transimpedance amplifier of a receiver circuit, rather than the inputs to the transconductance amplifier, to compensate for cable losses. In one particular embodiment, the compensation circuit transiently reduces the current into one branch of the transimpedance amplifier, while transiently boosting the current into the other branch. A voltage limiter is preferably connected to the output of the transimpedance amplifier to limit both its high and low voltage swings. This allows for the use of relatively high load resistances in the transimpedance amplifier without overdriving the second stage, the use of load resistances in the transconductance amplifier which keep that amplifier in a linear range during the transient period, and a combined amplifier gain significantly greater than unity.

In another aspect of the invention, a plurality of transient compensation signals with different respective time constants are independently applied into the transimpedance amplifier in a multi-order compensation scheme. The various compensation currents can also have different respective peak amplitude values.

These and other features and advantages of the invention will be apparent to those skilled in the art from the following detailed description, taken together with the accompanying drawings.

DETAILED DESCRIPTION OF THE INVENTION

The following detailed description is given in the context of an ATE system. However, the invention is applicable in general to receiver circuits which suffer from signal distortion in the receive transmission medium. Such circuits include differential receiver circuits in general, such as differential line receivers for clock or data recovery circuits, and telecommunication input circuits. ATE receivers can be considered as a special case of such differential receivers, with one signal (the DUT output) received via a transmission medium, and the other signal (the reference signal) generated locally.

Figure 8:
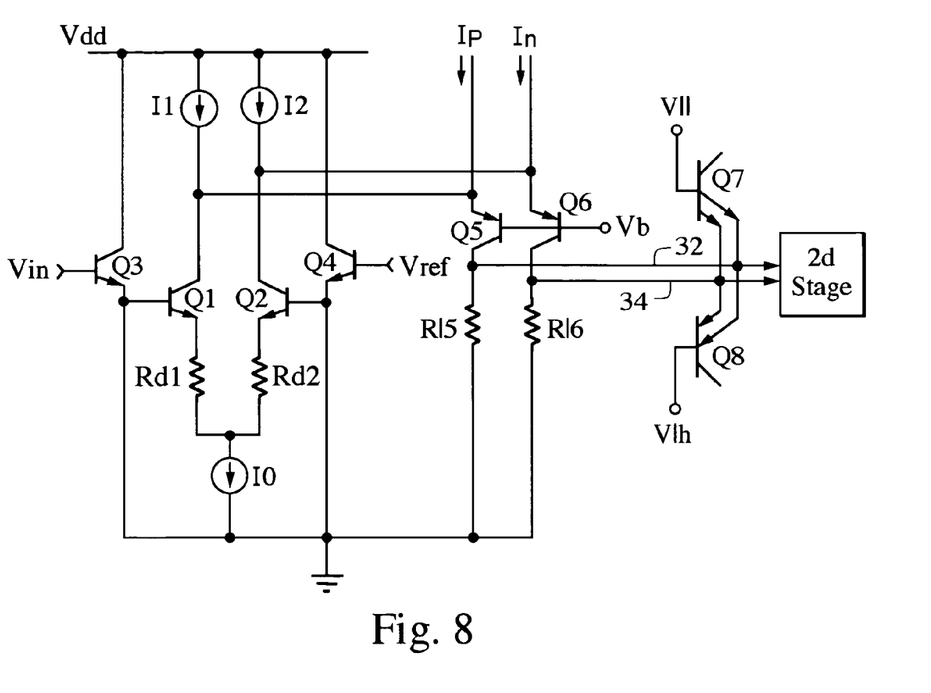
FIG. 8 is a simplified schematic diagram illustrating one embodiment of the present invention.

FIG. 8 illustrates one embodiment of the invention, in which compensation currents are injected at a different location of an ATE comparator to overcome the problems found in the prior art. ("Injected" is not intended to be limited to a particular direction of current flow, and can include current flows both toward and away from the amplifier.) The same basic comparator input stage, including transconductance and transimpedance amplifiers, is shown, along with degenerative resistors Rd1 and Rd2 between Q1, Q2 respectively and I0 in the transconductance amplifier. However, instead of applying compensation currents to the reference input of the transconductance amplifier, the currents are applied instead to the transimpedance amplifier. Specifically, Ip and In are injected into the emitters of Q5 and Q6, respectively, the transistors that constitute the transimpedance amplifier branches which receive currents from the input and reference branches of the transconductance amplifier, respectively.

The differential input voltage signal Vin/Vref is first transformed into the current domain via the transconductance of the input differential pair Q1/Q2. Ip and In are then summed into the low impedance current nodes at the collectors of Q5 and Q6, respectively. The resulting summation of currents is converted back into the voltage domain by the resistively loaded pnp folded cascode transistors Q5 and Q6. The result is to compensate for cable losses without the problems associated with the prior approach. (The term "compensation" as used herein includes a partial but noticeable compensation, and does not require absolute 100% compensation.)

One advantage of this new technique is that the circuit topology is quite similar to the commonly implemented comparator input stage shown in FIG. 2. No significant circuitry needs to be included at the comparator input stage to obtain the cable loss compensation functionality. However, as described so far it does have disadvantages relating to overdriving the second stage, requiring the transconductance amplifier to stay in a linear range during the transient compensation period, and limiting the gain of the first stage.

If the corrective currents Ip and In are to superimpose the correct compensating characteristic onto the current domain input to the transimpedance amplifier, they must maintain a certain linear correspondence with the voltage domain input of the comparator. In other words, if a 1V input applied to the differential pair Q1/Q2 generates a 1 mA differential current in the emitters of Q5/Q6 (a transconductance of 1 mA/V), then a 1 mA current injected at Ip or In should effectively represent the equivalent of 1V at the input to the comparator. The transconductance of the input stage should remain linear over the voltage range that Ip and In are expected to represent.

Applying this to the previous discussed example of a comparator with a 4V input range and a requirement for a 20% corrective peaking response, the input stage should maintain its transconductance over a 0.8V range. For the circuit shown in FIG. 8, this implies that the product of the tail current I0 and the degeneration resistor Rd1 or Rd2 must be at least 0.8V. If the power dissipation is to remain reasonable, the tail current I0 should be on the order of 1 mA, resulting in a degeneration resistor value of 800 ohm (1 mA×800 ohm=0.8V).

It is well known that, for a comparator to have desirable properties such as low offset error and stable propagation delay over various input conditions, the gain of the input stage should be relatively high. In the example given, however, if Rd=800 ohm, then the transimpedance load resistors Rl5 and Rl6 must also be 800 ohm just to achieve unity gain for the input stage. This means that all of the nonidealities of the input stage will be suffered again in the second stage, effectively doubling the undesirable characteristics of the comparator. If Rd1 and Rd2 are made significantly greater than 800 ohms, there will not be sufficient bandwidth for the circuit to function in a useful manner. Moreover, if the gain is in fact made unity, the resulting signal at the output of this stage will be approximately 4V when 4V is presented to the input. This would cause significant overdrive to the second stage, resulting in overshoot and asymmetry problems in the eventual output waveform. To reduce this problem to acceptable levels, the signal presented to the second stage should be on the order of 0.4V or lower. As the circuit of FIG. 8 has been described thus far, for the 4V input example this would imply a gain of 0.1, which would increase the undesirable characteristics of the comparator by nearly a factor of 10, making it unsuitable for use in a state of the art ATE system.

These problems are solved in an elegant manner by limiting the voltage swing at the transimpedance amplifier output with a set of voltage limiters that effectively limit the amplitude of the signal that is presented to the second stage. There are numerous ways to implement a voltage limiter. In the example of FIG. 8, a double-emitter npn transistor Q7 is used to limit the low voltage excursion of the first stage outputs, while a double-emitter pnp transistor Q8 is used to limit the high voltage excursion of the same output lines. The base of Q7 is set at a low voltage limit bias level of Vll, equal to the desired low voltage output limit for the first stage plus the base-emitter voltage drop of Q7, while its emitters are connected to respective first stage output lines 32 and 34. The collector of Q7 can be connected to a positive supply reference to shunt current during its low level clamping action.

In a similar manner, the upper limit of the first stage's output voltage swing is set by the double-emitter pnp transistor Q8, the base of which is set at a bias level Vlh equal to the desired high voltage limit less the base-emitter voltage drop of Q8, with its emitters also connected to respective first stage output lines 32 and 34. Similar to Q7, the collector of Q8 can be connected to a negative supply reference to shunt current during its high level clamping action. Instead of double-emitter transistors, pairs of separate transistors could also be used.

Q7 and Q8 add negligible parasitic capacitance to the high impedance first stage output nodes, and their recovery time is fast. As a result of their voltage limiting action, the transimpedance amplifier load resistors Rl5 and Rl6 can be made as large as bandwidth requirements permit, without causing an overdrive condition at the input of the second stage. The transconductance amplifier's degenerative resistors Rd1 and Rd2 can be independently determined by the linearity range requirement. The overall gain through the active switching region of the circuit can be made significantly greater than unity, while still providing adequate bandwidth at reasonably low power. Furthermore, unlike the circuit of FIG. 7, the new approach presents no parasitic RC time constant to interfere with the intended characteristic of the Ip and In corrective signals. This makes it easier to accurately tailor the response of the compensation circuit to more closely match the transmission path.

Figure 9:
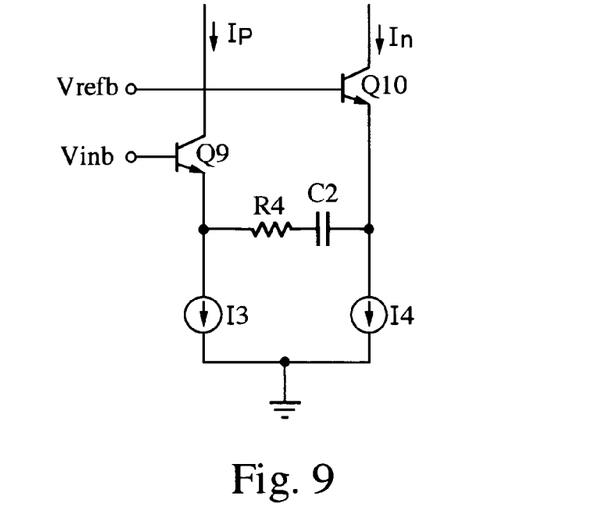
FIG. 9 is a simplified schematic diagram showing another circuit that can be used to generate the compensation current.

An alternate circuit to generate Ip and In is shown in FIG. 9. A pair of equal value current sources I3 and I4 draw currents of Ipk/2 through npn transistors Q9 and Q10, respectively, to establish Ip and In. The buffered input signal, after buffering by Q3 of FIG. 8 (the signal is designated Vinb) is applied to the base of Q9, while the buffered reference voltage, after buffering by Q4 of FIG. 8 (designated Vrefb) is applied to the base of Q10. An RC circuit consisting of series connected resistor R4 and capacitor C2 is connected across the emitter of Q9 and Q10, with the transistor collector currents establishing Ip and In, respectively.

In response to an increase in Vin, the bias on Q9 increases and the transistor is forced to conduct more current. Since I3 and I4 are fixed current sources, the additional current carried by Q9 is diverted through R4 and C2 into I4, with a corresponding reduction in the In current through Q10 in a differential shift based upon the change in the relative values of Vinb and Vrefb. C2 progressively charges up due to the current flowing through it, eventually operating as a DC open circuit to terminate the compensation current pulse.

If C2 is short circuited, the circuit of FIG. 9 is equivalent to a conventional differential pair circuit with two resistors and one current source. C2 constrains the circuit to appear as a differential pair only for a short time scale, and to appear as a pair of balanced emitter followers for a long time scale. At the beginning of a rapid change in input voltage, C2 appears as a short circuit, and Ip and In change accordingly. As C2 charges up and appears more open circuit, the circuit appears less as a differential pair and more as a pair of emitter followers. This transition from an unbalanced differential pair to a balanced pair of emitter followers gives the Ip and In current traces the desired shape, which is the shape of the RC charging characteristic.

If the circuit were implemented as a conventional differential pair, with degeneration resistors at the emitters of Q9, Q10 and a single current source, a capacitor placed in series with each resistor would cause the collector currents to go to zero at steady state, which would interfere with correct biasing of the circuit. If the capacitors were placed in parallel with the resistors, the resistors would never be open circuited as the capacitors charged up, and Ip/In would remain at an imbalance. The circuit of FIG. 9 avoids these problems.

Figure 10:
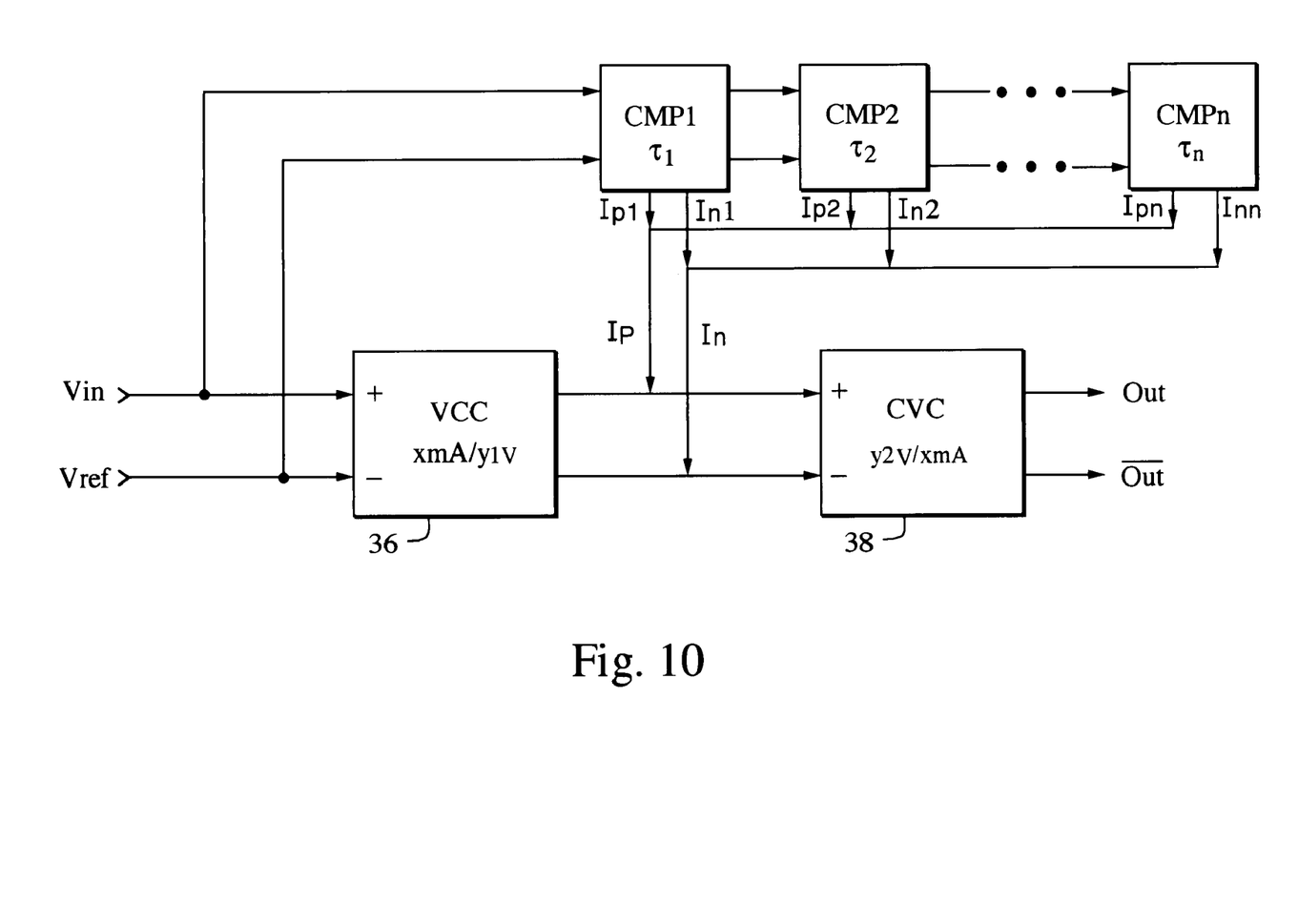
FIG. 10 is a block diagram illustrating the use of multiple compensation current pairs with different respective time constants.

The invention is considered from a more generic point of view in FIG. 10, in which the specific transconductance and transimpedance amplifiers of FIG. 8 have been generalized to a VTC 36 and CTV 38 that are not limited to any particular circuit implementation. VTC 36 converts its voltage input to a current output with a gain (output/input ratio) of xmA/$y_1$V, while CTV 38 converts its current input to a voltage output with a gain of $y_2$V/xmA; the overall gain is $y_2/y_1$.

The voltage input is simultaneously applied to a series of compensation circuits CMP1, CMP2 . . . CMPn, which produce respective compensation currents Ip1/In1, Ip2/In2 . . . Ipn/Inn. Each pair of compensation currents is characterized by a unique time constant $\tau_n$ that governs how quickly the respective compensation pulse decays. The different time constants are achieved by adjusting the values of R4 and/or C2 for the different compensation circuits, if the circuitry of FIG. 9 is employed, to give each compensation circuit a unique RC multiple. If the circuit of FIG. 6 is employed, adjustments would be made to R1, R2 and/or C1 of each compensation circuit to achieve the same result. Thus, the Vin input is simultaneously differentiated an arbitrary number of times, using as many time constants as desired. The Ip compensation currents are summed together, as are the In compensation currents, and combined with the input currents to CTV 38. The output voltage of CTV 38 is preferably limited, using a set of high/low voltage limiters as in FIG. 8, to prevent overdriving the second stage.

In addition to varying the time constant among the different compensation circuits, the peak values of the compensation currents can also be varied. If the compensation circuit of FIG. 9 is employed, this could be accomplished by adjusting the values of I3 and I4 for each compensation module. This provides an additional degree of flexibility in accurately replicating and compensating for cable losses over a broad frequency range.

While particular embodiments of the invention have been shown and described, numerous variations and ultimate embodiments will occur to those skilled in the art. For example, rather than generating Ip and In as symmetrical current pulses, they could be made asymmetrical, or one could even be omitted, as long as the net effect was to adjust the CTV output so as to compensate for cable loss. A different transistor family, such as MOSFET, or bipolar transistors with a reversal of polarity from that shown in the drawings, could be used, and Vin could be increased instead of (or in addition to) reducing Vref. Accordingly, it is intended that the invention be limited only in terms of the appended claims.

I claim:

1. A receiver circuit, comprising:
   a transconductance amplifier adapted to compare a dynamically changing input signal received via a transmission medium with a reference signal,
   a transimpedance amplifier connected to receive the output of said transconductance amplifier, and
   a compensation circuit connected to generate and apply a compensation signal which dynamically changes, in accordance with changes in the level of said input signal, to an input of said transimpedance amplifier to compensate for signal distortions from said transmission medium by dynamically changing the output of said transimpedance amplifier in accordance with said compensation signal.

2. The receiver circuit of claim 1, wherein said compensation circuit is connected to inject a compensation current into said transimpedance amplifier.

3. The receiver circuit of claim 2, further comprising a voltage limiter connected to the output of said transimpedance amplifier to limit its voltage swing.

4. The receiver circuit of claim 3, said voltage limiter limiting the extent of both high and low voltage swings at said transimpedance amplifier output.

5. The receiver circuit of claim 3, wherein the combined gain of said transconductance and transimpedance amplifiers is greater than unity.

6. The receiver circuit of claim 2, wherein said compensation circuit injects a plurality of transient compensation currents with different respective time constants into the input of said transimpedance amplifier.

7. The receiver circuit of claim 6, wherein at least some of said compensation currents have different respective peak values.

8. The receiver circuit of claim 1, adapted for automatic test equipment (ATE), wherein said transconductance amplifier is adapted to compare said input signal received via said transmission medium from a device under test (DUT) with said reference signal.

9. The receiver circuit of claim 1, said input and reference signals collectively comprising a differential signal.

10. A receiver circuit, comprising:
a transconductance amplifier adapted to compare an input signal received via a transmission medium with a reference signal,
a transimpedance amplifier connected to receive the output of said transconductance amplifier, and
a compensation circuit connected to apply a compensation signal to an input of said transimpedance amplifier to compensate for signal distortions from said transmission medium, wherein said compensation circuit is connected to inject a compensation current into said transimpedance amplifier,
said transconductance amplifier including an input branch for receiving said input signal and a reference branch for receiving said reference signal, said input and reference branches providing current outputs to respective input and reference branches of said transimpedance amplifier, wherein said compensation circuit transiently reduces the current into one branch of said transimpedance amplifier and transiently boosts the current into its other branch.

11. A receiver circuit, comprising:
a transconductance amplifier adapted to compare an input signal received via a transmission medium with a reference signal,
a transimpedance amplifier connected to receive the output of said transconductance amplifier,
a compensation circuit connected to apply a compensation signal to an input of said transimpedance amplifier to compensate for signal distortions from said transmission medium, wherein said compensation circuit is connected to inject a compensation current into said transimpedance amplifier, and
a voltage limiter connected to the output of said transimpedance amplifier to limit its voltage swing,
said transconductance and transimpedance amplifiers collectively comprising a first comparator stage, further comprising a second comparator stage driven by said transimpedance amplifier, said transimpedance amplifier including load resistances with resistance values high enough to overdrive said second stage in the absence of said voltage limiter, said voltage limiter preventing the second stage from being overdriven.

12. A receiver circuit, comprising:
a transconductance amplifier adapted to compare an input signal received via a transmission medium with a reference signal,
a transimpedance amplifier connected to receive the output of said transconductance amplifier,
a compensation circuit connected to apply a compensation signal to an input of said transimpedance amplifier to compensate for signal distortions from said transmission medium, wherein said compensation circuit is connected to inject a compensation current into said transimpedance amplifier, and
a voltage limiter connected to the output of said transimpedance amplifier to limit its voltage swing,
wherein said compensation circuit compensates for a transient distortion from said transmission medium, and said transconductance amplifier includes load resistances with resistance values that keep said transconductance amplifier in a linear range during the transient period.

13. In a receiver circuit adapted to receive an input signal via a transmission medium that adds a transient distortion to the signal, the improvement comprising:
a compensation circuit connected to inject a plurality of transient compensation signals with different respective time constants into said receiver circuit to compensate for said distortion by adjusting an output signal from said receiver circuit in accordance with said compensation signals.

14. The receiver circuit of claim 13, wherein at least some of said compensation signals have different respective peak currents.

15. The receiver circuit of claim 13, including a transconductance amplifier adapted to compare said input signal with a reference signal and to produce a current output, and a transimpedance amplifier connected to receive said current output, said compensation circuit injecting said compensation signals as compensation currents into said current output.

16. The receiver circuit of claim 15, said input and reference signals collectively comprising a differential signal.

17. The receiver circuit of claim 13, adapted for automatic test equipment (ATE), wherein said receiver circuit is adapted to receive said input signal via said transmission medium from a device under test (DUT).

18. A receiver circuit, comprising:
a voltage-to-current converter (VTC) adapted to compare a dynamically changing input voltage received via a transmission medium with a reference voltage, and to produce a current output,
a current-to-voltage converter (CTV) connected to convert the current output from said VTC to a voltage output, and
a compensation circuit connected to generate and apply a compensation signal which dynamically changes, in accordance with changes in the level of said input signal, to said CTV to compensate for signal distortions in said transmission medium by dynamically changing the output of said CTV in accordance with said compensation signal.

19. The receiver circuit of claim 18, wherein said compensation circuit is connected to inject a compensation current into said CTV.

20. The receiver circuit of claim 19, further comprising a voltage limiter connected to the output of said CTV to limit its voltage swing.

21. The receiver circuit of claim 20, said voltage limiter limiting the extent of both high and low voltage swings at said CTV output.

22. The receiver circuit of claim 20, wherein the combined gain of said VTC and CTV is greater than unity.

23. The receiver circuit of claim 19, wherein said compensation circuit injects a plurality of transient compensation currents with different respective time constants into said VTC current output.

24. The receiver circuit of claim 23, wherein at least some of said compensation currents have different respective peak values.

25. The receiver circuit of claim 18, adapted for automatic test equipment (ATE), wherein said VTC is adapted to compare said input voltage received via said transmission medium from a device under test (DUT) with said reference voltage.

26. The receiver circuit of claim 18, said input and reference voltages collectively comprising a differential signal.

27. A receiver circuit, comprising:
a voltage-to-current converter (VTC) adapted to compare an input voltage received via a transmission medium with a reference voltage, and to produce a current output,
a current-to-voltage converter (CTV) connected to convert the current output from said VTC to a voltage output, and
a compensation circuit connected to apply a compensation signal to said CTV to compensate for signal distortions in said transmission medium, wherein said compensation circuit is connected to inject a compensation current into said CTV,
said VTC providing a pair of current outputs to respective input and reference branches of said CTV, wherein said compensation circuit transiently reduces the current into one branch and transiently boosts the current into the other branch.

28. A receiver circuit, comprising:
a voltage-to-current converter (VTC) adapted to compare an input voltage received via a transmission medium with a reference voltage, and to produce a current output,
a current-to-voltage converter (CTV) connected to convert the current output from said VTC to a voltage output,
a compensation circuit connected to apply a compensation signal to said CTV to compensate for signal distortions in said transmission medium, wherein said compensation circuit is connected to inject a compensation current into said CTV, and
a voltage limiter connected to the output of said CTV to limit its voltage swing,
said VTC and CTV collectively comprising a first comparator stage, further comprising a second comparator stage driven by said CTV, said CTV including load resistances with resistance values high enough to overdrive said second stage in the absence of said voltage limiter, said voltage limiter preventing the second stage from being overdriven.

29. A receiver circuit, comprising:
a voltage-to-current converter (VTC) adapted to compare an input voltage received via a transmission medium with a reference voltage, and to produce a current output,
a current-to-voltage converter (CTV) connected to convert the current output from said VTC to a voltage output,
a compensation circuit connected to apply a compensation signal to said CTV to compensate for signal distortions in said transmission medium, wherein said compensation circuit is connected to inject a compensation current into said CTV, and
a voltage limiter connected to the output of said CTV to limit its voltage swing,
wherein said compensation circuit compensates for a transient distortion from said transmission medium, and said VTC includes load resistances with resistance values that keep said VTC in a linear range during the transient period.

* * * * *